(12) United States Patent
Zhou

(10) Patent No.: US 12,310,045 B2
(45) Date of Patent: May 20, 2025

(54) HIGH ELECTRON MOBILITY TRANSISTOR

(71) Applicant: UNITED MICROELECTRONICS CORP., Hsin-Chu (TW)

(72) Inventor: Zhibiao Zhou, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 368 days.

(21) Appl. No.: 17/746,923

(22) Filed: May 17, 2022

(65) Prior Publication Data

US 2023/0335629 A1 Oct. 19, 2023

(30) Foreign Application Priority Data

Apr. 19, 2022 (CN) .......................... 202210409609.9

(51) Int. Cl.
*H01L 29/778* (2006.01)
*H10D 30/47* (2025.01)
*H10D 64/62* (2025.01)
*H10D 64/64* (2025.01)

(52) U.S. Cl.
CPC ............. *H10D 30/47* (2025.01); *H10D 64/62* (2025.01); *H10D 64/64* (2025.01)

(58) Field of Classification Search
None
See application file for complete search history.

(56) References Cited

U.S. PATENT DOCUMENTS

| | | | |
|---|---|---|---|
| 5,358,878 A * | 10/1994 | Suchet | H01L 29/66462 977/723 |
| 6,177,292 B1 | 1/2001 | Hong et al. | |
| 8,450,760 B2 | 5/2013 | Bhat et al. | |
| 9,917,187 B2 * | 3/2018 | Donkers | H01L 21/31 |
| 10,002,928 B1 * | 6/2018 | Raring | H01L 27/088 |
| 2006/0226442 A1 * | 10/2006 | Zhang | H01L 29/7787 257/E29.253 |
| 2010/0102358 A1 * | 4/2010 | Lanzieri | H01L 29/7785 257/E21.403 |
| 2014/0246699 A1 * | 9/2014 | Radulescu | H01L 29/42364 257/194 |
| 2015/0255547 A1 * | 9/2015 | Yuan | H01L 29/66462 257/76 |
| 2017/0278961 A1 | 9/2017 | Hill | |
| 2020/0020681 A1 * | 1/2020 | Boles | H01L 27/0629 |
| 2020/0227547 A1 | 7/2020 | Yue | |
| 2021/0336016 A1 * | 10/2021 | Hsieh | H01L 21/02164 |
| 2022/0029005 A1 * | 1/2022 | Lee | H01L 29/66462 |
| 2022/0029009 A1 | 1/2022 | Sugiyama | |
| 2023/0178611 A1 * | 6/2023 | Raring | H01L 27/0605 438/31 |

FOREIGN PATENT DOCUMENTS

WO 2021/257965 A1 12/2021

* cited by examiner

*Primary Examiner* — William C Trapanese
(74) *Attorney, Agent, or Firm* — Winston Hsu

(57) ABSTRACT

A high electron mobility transistor (HEMT) includes a first doped layer disposed in a substrate, a mesa isolation disposed on the substrate, a gate electrode disposed on the mesa isolation, a source electrode and a drain electrode disposed adjacent to two sides of the gate electrode, a passivation layer disposed on the mesa isolation and around the source electrode and the drain electrode, a first metal line connecting the source electrode and the first doped layer, and a second metal line connecting the drain electrode and the first doped layer.

20 Claims, 4 Drawing Sheets

HIGH ELECTRON MOBILITY TRANSISTOR

BACKGROUND OF THE INVENTION

1. Field of the Invention

The invention relates to a high electron mobility transistor (HEMT) having a doped layer.

2. Description of the Prior Art

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

According to an embodiment of the present invention, a high electron mobility transistor (HEMT) includes a first doped layer disposed in a substrate, a mesa isolation disposed on the substrate, a gate electrode disposed on the mesa isolation, a source electrode and a drain electrode disposed adjacent to two sides of the gate electrode, a passivation layer disposed on the mesa isolation and around the source electrode and the drain electrode, a first metal line connecting the source electrode and the first doped layer, and a second metal line connecting the drain electrode and the first doped layer.

According to another aspect of the present invention, a high electron mobility transistor (HEMT) includes a first doped layer on a surface of a substrate, a mesa isolation on the substrate, a gate electrode on the mesa isolation, and a source electrode and a drain electrode adjacent to two sides of the gate electrode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
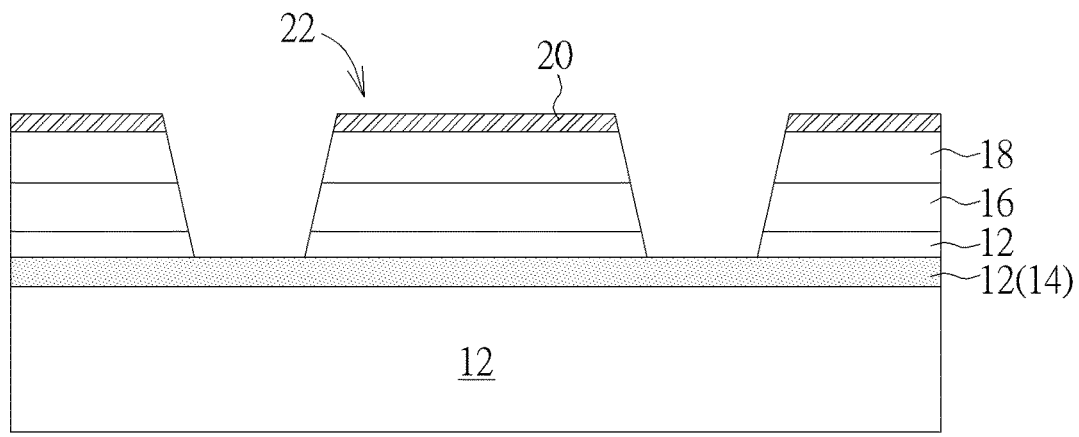
FIGS. 1-2 illustrate a method for fabricating a HEMT according to an embodiment of the present invention.
Figure 2:
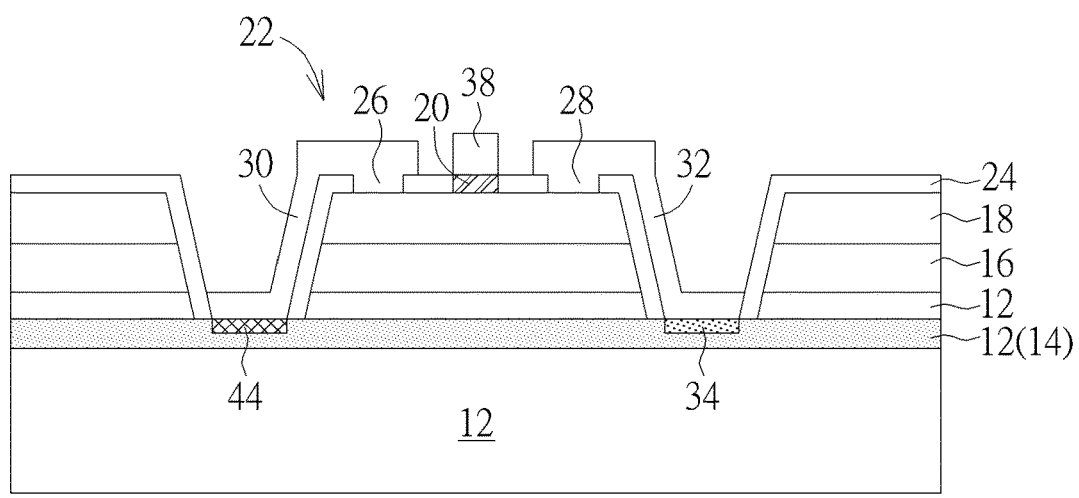

Referring to FIGS. 1-2, FIGS. 1-2 illustrate a method for fabricating a HEMT according to an embodiment of the present invention. As shown in FIG. 1, a substrate 12 such as a substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate.

Next, an ion implantation process is conducted to form a doped layer 14 or doped region in the substrate 12. Preferably, the doped layer 14 could be made of a doped region having n-type dopants or a doped region having p-type dopants and the doped layer 14 is formed completely within the substrate 12 as the top surface of the doped layer 14 is not exposed. In other word, the top surface of the doped layer 14 is slightly lower than the top surface of the substrate 12.

Next, a selective nucleation layer (not shown) and a buffer layer 16 are formed on the substrate 12. According to an embodiment of the present invention, the nucleation layer preferably includes aluminum nitride (AlN) and the buffer layer 16 is preferably made of III-V semiconductors such as gallium nitride (GaN), in which a thickness of the buffer layer 16 could be between 0.5 microns to 10 microns. According to an embodiment of the present invention, the formation of the buffer layer 16 on the substrate 12 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a selective unintentionally doped (UID) buffer layer (not shown) could be formed on the surface of the buffer layer 16. In this embodiment, the UID buffer layer could be made of III-V semiconductors such as gallium nitride (GaN) or more specifically unintentionally doped GaN. According to an embodiment of the present invention, the formation of the UID buffer layer on the buffer layer 16 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a barrier layer 18 is formed on the surface of the UID buffer layer or buffer layer 16. In this embodiment, the barrier layer 18 is preferably made of III-V semiconductor such as n-type or n-graded aluminum gallium nitride ($Al_xGa_{1-x}N$), in which $0<x<1$, the barrier layer 18 preferably includes an epitaxial layer formed through epitaxial growth process, and the barrier layer 18 could include dopants such as silicon or germanium. Similar to the buffer layer 16, the formation of the barrier layer 18 on the buffer layer 16 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a p-type semiconductor layer 20 is formed on the barrier layer 18. In this embodiment, the p-type semiconductor layer 20 preferably is a III-V compound layer including p-type GaN (p-GaN) and the formation of the p-type semiconductor layer 20 on the surface of the barrier layer 18 could be accomplished by a molecular-beam epitaxy (MBE)

process, a metal organic chemical vapor deposition (MOCVD) process, a chemical vapor deposition (CVD) process, a hydride vapor phase epitaxy (HVPE) process, or combination thereof.

Next, a MESA isolation process is conducted to form a mesa isolation 22 so that devices could be isolated to operate independently without affecting each other. In this embodiment, the MESA isolation process could be accomplished by conducting a photo-etching process to remove part of p-type semiconductor layer 20, part of the barrier layer 18, part of the buffer layer 16, part of the substrate 12, and even part of the doped layer 14 to expose the top surface of the doped layer 14, in which the sidewalls of the patterned p-type semiconductor layer 20, the patterned barrier layer 18, and the patterned buffer layer 16 are aligned. Preferably, each of the mesa isolations 22 includes part of the substrate 12, the patterned buffer layer 16, the patterned barrier layer 18, and the patterned p-type semiconductor layer 20, in which the thickness of the patterned buffer layer 16 is approximately 300 nm, the thickness of the patterned barrier layer 18 is approximately 10 nm, and the thickness of the patterned p-type semiconductor layer 20 is approximately 100 nm.

Next, as shown in FIG. 2, a photo-etching process is conducted to remove part of the p-type semiconductor layer 20 as the patterned p-type semiconductor layer 20 preferably serves as part of the gate structure for the HEMT device in the later process. Next, a passivation layer 24 is conformally formed on the barrier layer 18 to cover the top surface and sidewalls of the mesa isolation 22. In this embodiment, the passivation layer 24 preferably includes silicon nitride and the thickness of the passivation layer 24 is approximately 200 nm, but not limited thereto.

Next, one or more photo-etching process is conducted to remove part of the passivation layer 24 and part of the barrier layer 18 for forming a plurality of recesses (not shown), a conductive material is formed on the passivation layer 24 and into the recesses, and one or more pattern transfer process is conducted to remove part of the conductive material for forming patterned metal lines serving as a source electrode 26 and a drain electrode 28. Preferably, the conductive material disposed directly on the source electrode 26 and extended onto the surface of the adjacent passivation layer 24 is serving as a source electrode extension 30 while the conductive material disposed directly on the drain electrode 28 and extended onto the surface of the adjacent passivation layer 24 is serving as a drain electrode extension 32.

It should be noted that the source electrode 26 and drain electrode 28 formed at this stage could be conductive contacts having same or different properties thereby achieving a diode characteristic or function. For instance, the source electrode 26 or source electrode extension 30 could be directly contacting the doped layer 14 underneath to form an ohmic contact while the drain electrode 28 or drain electrode extension 32 could also directly contacting the doped layer 14 to form an ohmic contact. Preferably, metal and the doped layer 14 could react completely to form a silicide 44 on the source electrode 26 end for forming an ohmic contact as an extra ion implantation process could be conducted on the drain electrode 28 end to implant dopants having conductive type opposite than that of the doped layer 14 onto the surface of the doped layer 14. This forms another doped layer 34 or ohmic contact on the drain electrode 28 end as the doped layer 14 could include n-type dopants while the doped layer 34 could include p-type dopants. In other word, in contrast to the ohmic contact on the source electrode 26 end formed by completely reacting the doped layer 14 with metal line to form a silicide 44, the ohmic contact on the drain electrode 28 end is formed by the PN junction between the doped layer 14 and the doped layer 34.

Figure 3:
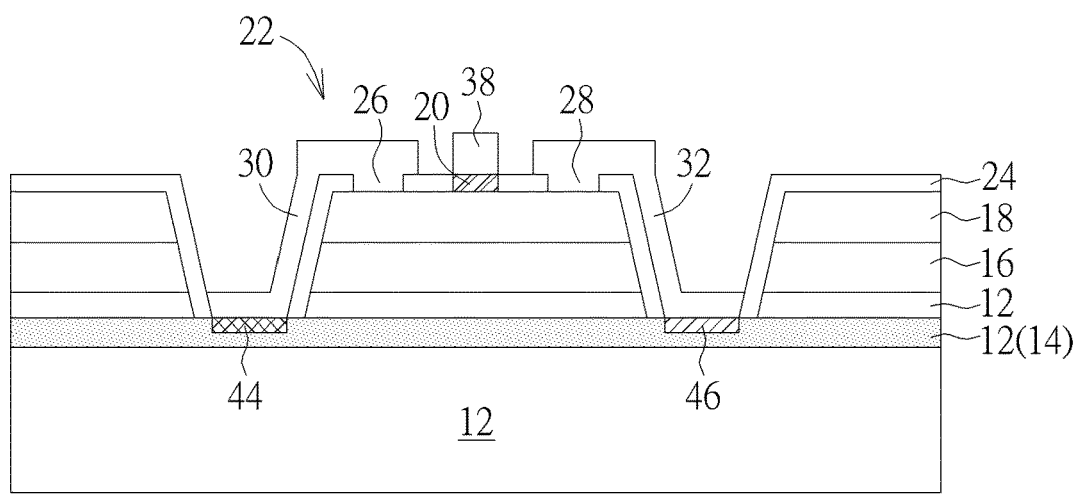
FIG. 3 illustrates a structural view of a HEMT according to an embodiment of the present invention.

Moreover, as shown in FIG. 3, in addition to both the source electrode 26 and the drain electrode 28 are ohmic contacts in the aforementioned embodiment, it would also be desirable to form an ohmic contact between the source electrode 26 or source electrode extension 30 and the contacted doped layer 14 underneath while a Schottky contact is formed between the drain electrode 28 or drain electrode extension 32 and the doped layer 14. For instance, an ohmic contact could be formed by completely reacting the source electrode extension 30 with the doped layer 14 to form a silicide 44 on the source electrode 26 end while on the drain electrode 28 end, a partially reacted silicide 46 could be formed by reacting the drain electrode extension 32 with the doped layer 14. It should be noted that the formation of the silicide 46 is accomplished by adjusting the thickness of metal being deposited and/or duration and temperature of the thermal treatment process conducted so that only part of the interface between the drain electrode extension 32 and the doped layer 14 is reacted while part of the interface between the drain electrode extension 32 and the doped layer 14 still remains un-reacted during the process. In other word, in addition to the silicide 46 being formed part of un-reacted metal still remains during the reaction process and this forms a Schottky contact on the drain electrode 28 end.

Next, another passivation layer (not shown) or hard mask is formed on the passivation layer 24, the source electrode extension 30, and the drain electrode extension 32, one or more photo-etching process is conducted to remove part of the passivation layer to form a recess (not shown) exposing the p-type semiconductor layer 20, another conductive material is formed on the passivation layer to fill the recess, and another photo-etching process is conducted to remove part of the conductive material for forming a gate electrode 38.

In this embodiment, the gate electrode 38, source electrode 26, and drain electrode 28 are preferably made of metal, in which the gate electrode 38 and the source electrode 26 could be made of same material or different materials, the gate electrode 38 and the drain electrode 28 could be made of same material or different materials, and the source electrode 26 and the drain electrode 28 could be made of same material or different materials. According to an embodiment of the present invention, each of the gate electrode 38, source electrode 26, and drain electrode 28 could include gold (Au), silver (Ag), platinum (Pt), titanium (Ti), aluminum (Al), tungsten (W), palladium (Pd), or combination thereof. Moreover, it would be desirable to conduct an electroplating process, sputtering process, resistance heating evaporation process, electron beam evaporation process, physical vapor deposition (PVD) process, chemical vapor deposition (CVD) process, or combination thereof to form conductive materials in the aforementioned recesses and then pattern the conductive materials through single or multiple etching processes for forming the gate electrode 38, the source electrode 26, and the drain electrode 28.

Figure 4:
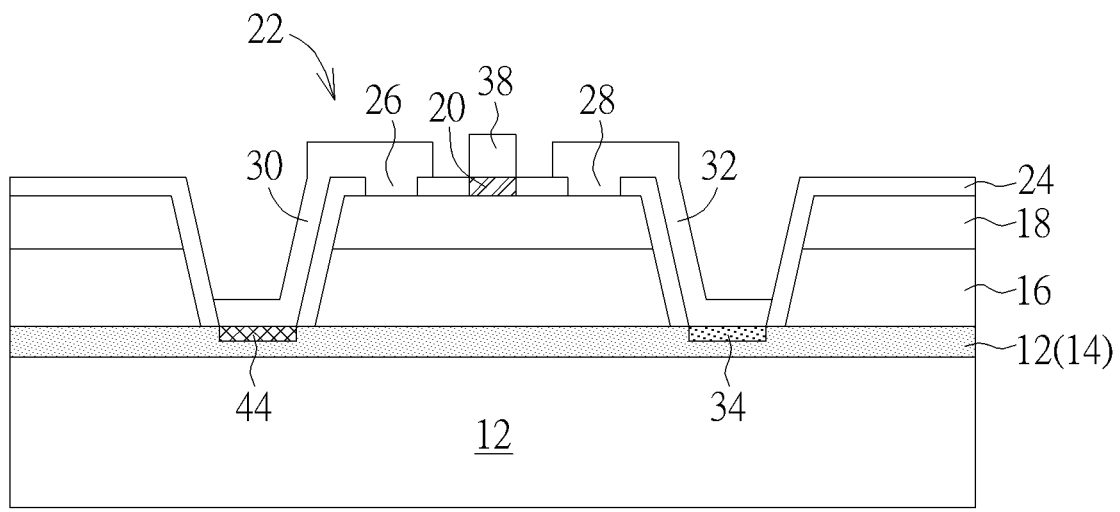
FIG. 4 illustrates a structural view of a HEMT according to an embodiment of the present invention.
Figure 5:
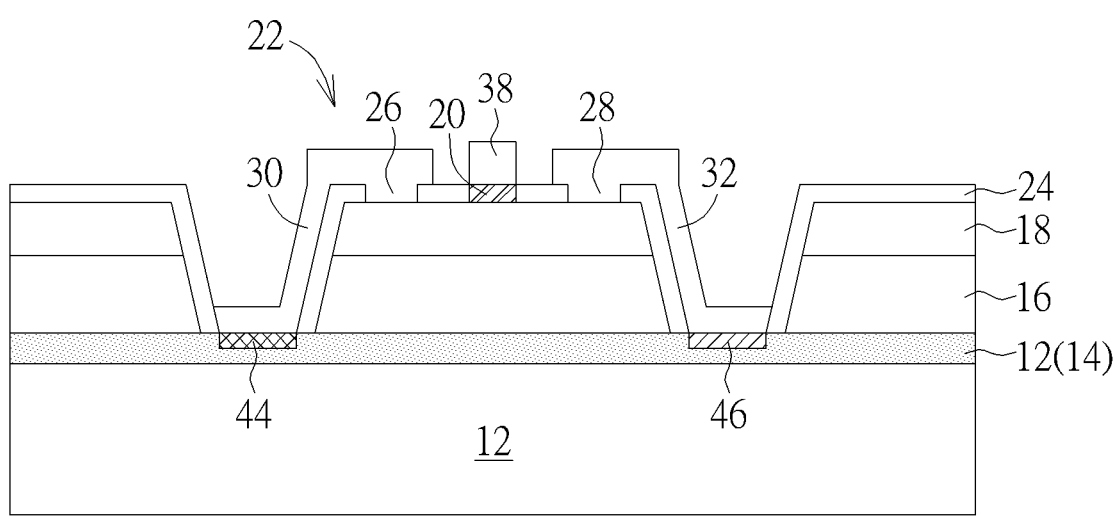
FIG. 5 illustrates a structural view of a HEMT according to an embodiment of the present invention.

Referring to FIGS. 4-5, FIGS. 4-5 illustrate structural views of a HEMT according to an embodiment of the present invention. As shown in FIGS. 4-5, in contrast to the doped layer 14 in FIGS. 2-3 is completely embedded within the substrate 12 without being exposed at all, it would also be desirable to form the doped layer 14 directly on the top surface of the substrate 12 so that the top surface of the doped layer 14 contacts the bottom surface of the buffer layer 16 directly. Similar to FIG. 2, the source electrode 26 end and the drain electrode 28 end shown in FIG. 4 could include same type of conductive contacts. For instance, an ohmic contact could be formed on the source side by reacting the source electrode 26 or source electrode extension 30 with the doped layer 14 underneath completely to form a silicide 44 while another ohmic contact could be formed on the drain side between the drain electrode 28 or drain electrode extension 32 and the PN junction formed between the doped layer 14 and doped layer 34.

Similar to FIG. 3, the source electrode 26 end and the drain electrode 28 end shown in FIG. 5 could include different types of conductive contacts. For instance, an ohmic contact could be formed on the source side by reacting the source electrode 26 or source electrode extension 30 with the doped layer 14 underneath completely to form a silicide 44 while a Schottky contact could be formed on the drain side by reacting the drain electrode 28 or drain electrode extension 32 with the doped layer 14 to form incompletely reacted silicide 46 or silicide with un-reacted metal remains.

Figure 6:
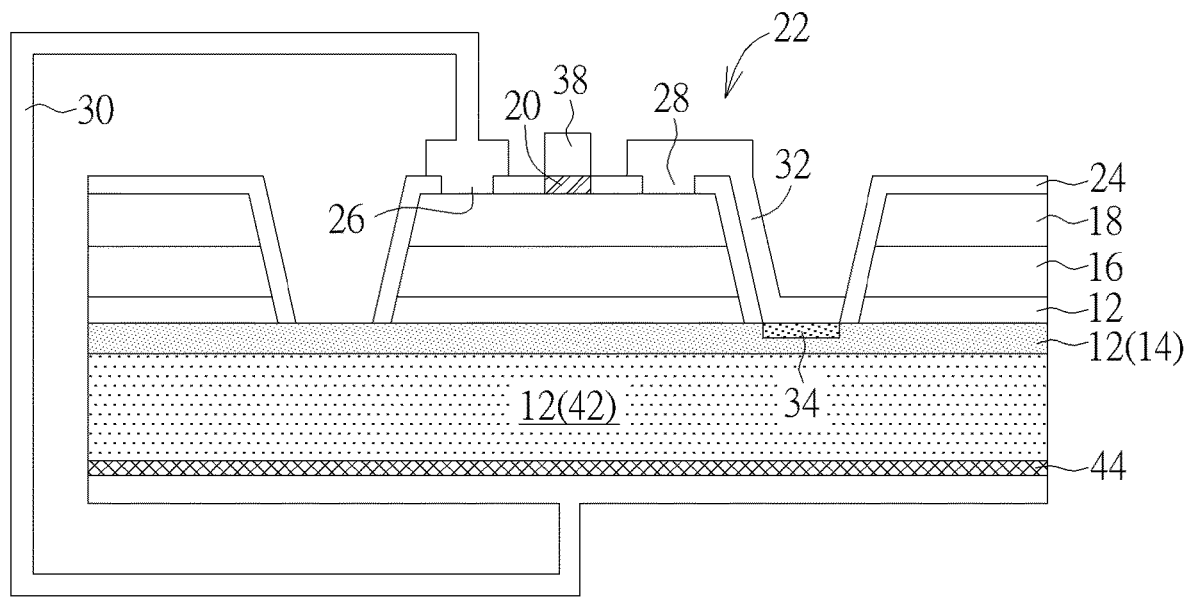
FIG. 6 illustrates a structural view of a HEMT according to an embodiment of the present invention.
Figure 7:
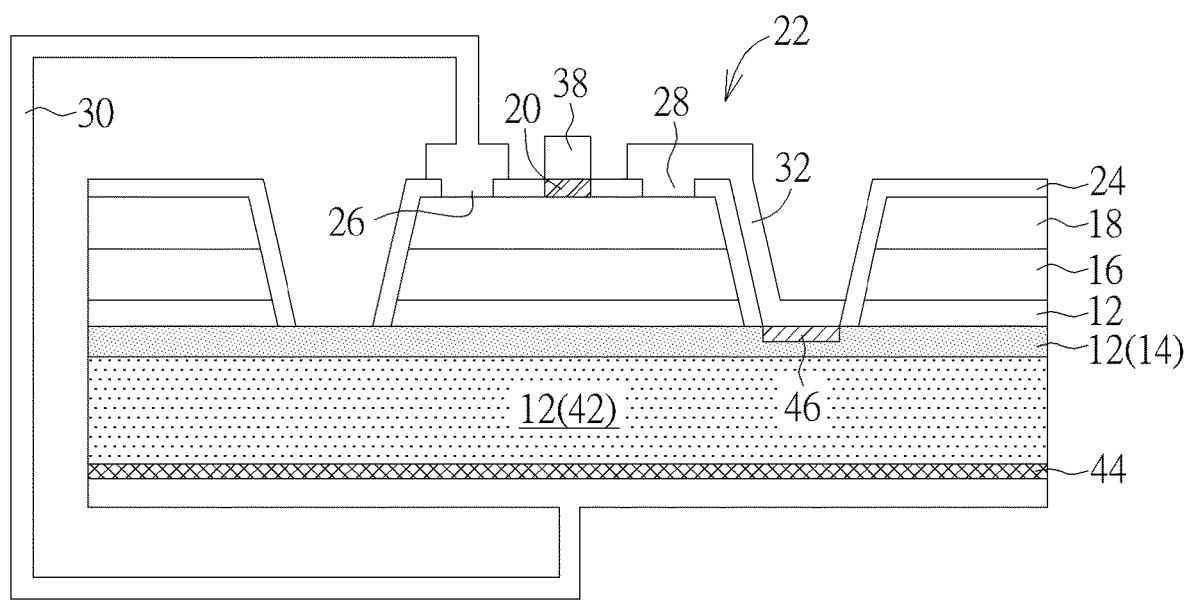
FIG. 7 illustrates a structural view of a HEMT according to an embodiment of the present invention.

Referring to FIGS. 6-7, FIGS. 6-7 illustrate structural views of a HEMT according to an embodiment of the present invention. As shown in FIGS. 6-7, in contrast to only a single doped layer 14 is formed in the substrate 12 as shown in FIG. 2, it would also be desirable to form another doped layer 42 having different conductive type than that of the doped layer 14 directly under the doped layer 14. For instance, the doped layer 14 could include a doped region made of n-type dopants while the doped layer 42 could include a doped region made of p-type dopants. Moreover, in contrast to the metal from the source electrode 26 end is directly contacting the doped layer 14 on top as shown in the aforementioned embodiment, the metal line on the source electrode 26 end such as the source electrode extension 30 is connected and directly contacting the bottom surface of the doped layer 42 on the back side of the substrate 12 while the metal line on the drain electrode 28 end such as the drain electrode extension 32 is still connected and directly contacting the top surface of the doped layer 14 on the front side of the substrate 12.

Similar to FIG. 2, the source electrode 26 end and the drain electrode 28 end shown in FIG. 6 could include same type of conductive contacts. For instance, an ohmic contact could be formed on the source side by reacting the source electrode 26 or source electrode extension 30 with the doped layer 42 completely to form a silicide 44 while another ohmic contact could be formed on the drain side between the drain electrode 28 or drain electrode extension 32 and the PN junction formed between the doped layer 14 and doped layer 34.

Similar to FIG. 3, the source electrode 26 end and the drain electrode 28 end shown in FIG. 7 could include different types of conductive contacts. For instance, an ohmic contact could be formed on the source side by reacting the source electrode 26 or source electrode extension 30 with the doped layer 42 completely to form a silicide 44 while a Schottky contact could be formed on the drain side by reacting the drain electrode 28 or drain electrode extension 32 with the doped layer 14 to form incompletely reacted silicide 46 or silicide with un-reacted metal remains.

Figure 8:
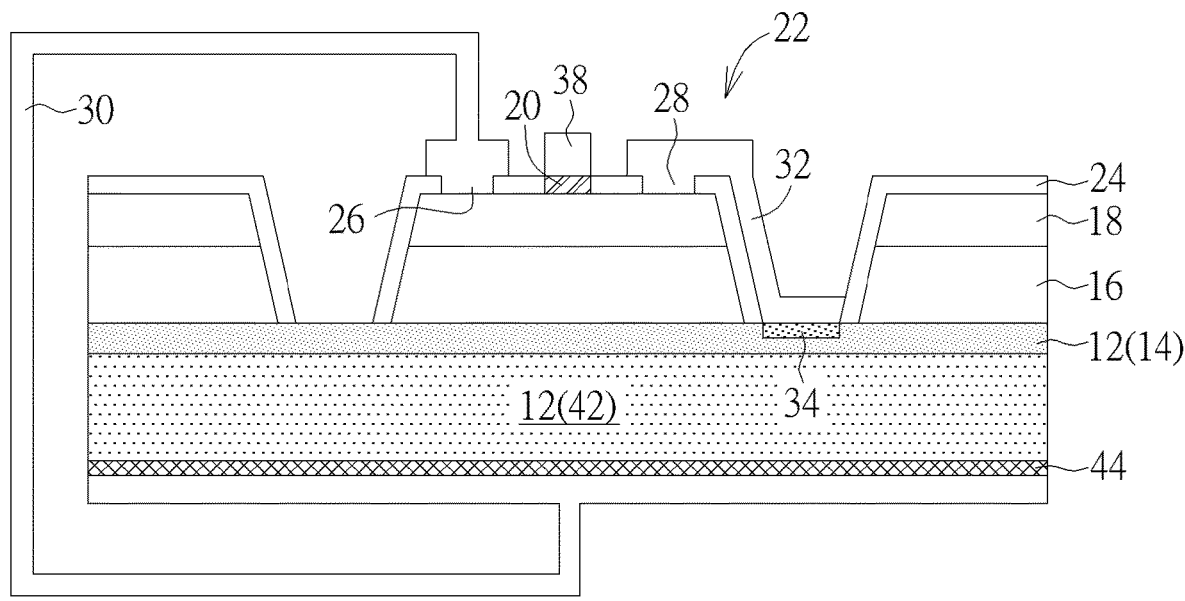
FIG. 8 illustrates a structural view of a HEMT according to an embodiment of the present invention.
Figure 9:
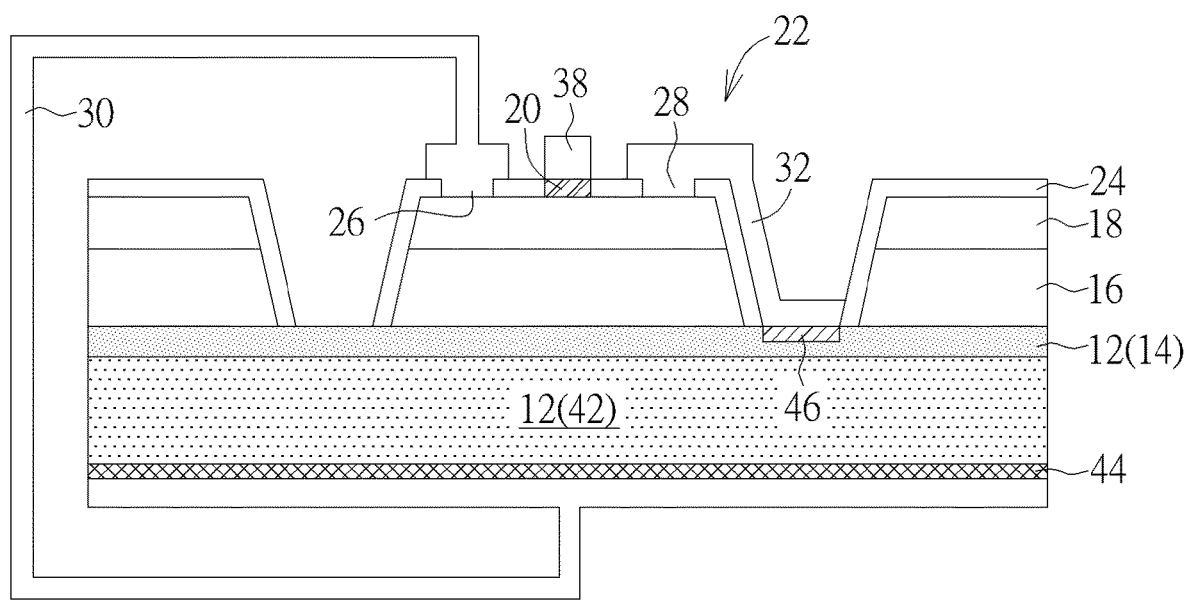
FIG. 9 illustrates a structural view of a HEMT according to an embodiment of the present invention.

Referring to FIGS. 8-9, FIGS. 8-9 illustrate structural views of a HEMT according to an embodiment of the present invention. As shown in FIGS. 8-9, it would be desirable to combine the embodiments shown in FIG. 4 and FIG. 6 by placing the doped layer 14 on a top surface of the substrate 12 and form two doped layers 14 and 42 having different conductive type in the substrate 12. Preferably, the metal line such as the source electrode extension 30 on the source electrode 26 end is extended to directly contact the bottom surface of the doped layer 42 on back side of the substrate 12 while the metal line such as the drain electrode extension 32 on the drain electrode 28 end is directly contacting the top surface of the doped layer 14.

Similar to FIG. 2, the source electrode 26 end and the drain electrode 28 end shown in FIG. 8 could include same type of conductive contacts. For instance, an ohmic contact could be formed on the source side by reacting the source electrode 26 or source electrode extension 30 with the doped layer 42 completely to form a silicide 44 while another ohmic contact could be formed on the drain side between the drain electrode 28 or drain electrode extension 32 and the PN junction formed between the doped layer 14 and doped layer 34.

Similar to FIG. 3, the source electrode 26 end and the drain electrode 28 end shown in FIG. 9 could include different types of conductive contacts. For instance, an ohmic contact could be formed on the source side by reacting the source electrode 26 or source electrode extension 30 with the doped layer 42 completely to form a silicide 44 while a Schottky contact could be formed on the drain side by reacting the drain electrode 28 or drain electrode extension 32 with the doped layer 14 to form incompletely reacted silicide 46 or silicide with un-reacted metal remains.

Overall, the present invention provides an approach including method and structure of using a HEMT device for implementing a diode, which principally forms one or more than one doped layers within the substrate or on a surface of the substrate and then forms same type or different types of conductive contacts on the source electrode end and drain electrode end respectively. According to an embodiment of the present invention, if the source electrode end and the drain electrode end were to be same type of conductive contacts, an ohmic contact could be formed on the source side by reacting the source electrode 26 or source electrode extension 30 with the doped layer 42 completely to form a silicide 44 while another ohmic contact could be formed on the drain side between the drain electrode 28 or drain electrode extension 32 and the PN junction formed between the doped layer 14 and doped layer 34.

Moreover, if the source electrode end and the drain electrode end were to be different types of conductive contacts, an ohmic contact could be formed on the source side by reacting the source electrode 26 or source electrode extension 30 with the doped layer 42 completely to form a silicide 44 while a Schottky contact could be formed on the drain side by reacting the drain electrode 28 or drain electrode extension 32 with the doped layer 14 to form incompletely reacted silicide 46 or silicide with un-reacted metal remains.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A high electron mobility transistor (HEMT), comprising:
 a first doped layer in a substrate;
 a mesa isolation on the substrate, wherein a top surface of the first doped layer in the substrate is even with a bottom surface of the mesa isolation;
 a gate electrode on the mesa isolation; and a source electrode and a drain electrode adjacent to two sides of the gate electrode.

2. The HEMT of claim 1, wherein the mesa isolation comprises:
a buffer layer on the substrate; and
a barrier layer on the buffer layer.

3. The HEMT of claim 1, further comprising:
a passivation layer on the mesa isolation and around the source electrode and the drain electrode;
a first metal line connecting the source electrode and the first doped layer; and
a second metal line connecting the drain electrode and the first doped layer.

4. The HEMT of claim 3, wherein the passivation layer is on a sidewall of the mesa isolation.

5. The HEMT of claim 1, further comprising:
a first ohmic contact on the first doped layer adjacent to the source electrode; and
a second ohmic contact on the first doped layer adjacent to the drain electrode.

6. The HEMT of claim 5, wherein the first doped layer comprises a first doped region and the second ohmic contact comprises a second doped region.

7. The HEMT of claim 6, wherein the first doped region and the second doped region comprise different conductive types.

8. The HEMT of claim 1, further comprising:
an ohmic contact on the first doped layer adjacent to the source electrode; and
a Schottky contact on the first doped layer adjacent to the drain electrode.

9. The HEMT of claim 1, further comprising:
a second doped layer in the substrate and under the first doped layer;
a first metal line connecting the source electrode and the second doped layer; and
a second metal line connecting the drain electrode and the first doped layer.

10. The HEMT of claim 9, wherein the first doped layer and the second doped layer comprise different conductive type.

11. A high electron mobility transistor (HEMT), comprising:
a first doped layer on a surface of a substrate;
a mesa isolation on the substrate, wherein a top surface of the first doped layer is even with a bottom surface of the mesa isolation;
a gate electrode on the mesa isolation; and
a source electrode and a drain electrode adjacent to two sides of the gate electrode.

12. The HEMT of claim 11, wherein the mesa isolation comprises:
a buffer layer on the substrate; and
a barrier layer on the buffer layer.

13. The HEMT of claim 11, further comprising:
a passivation layer on the mesa isolation and around the source electrode and the drain electrode;
a first metal line connecting the source electrode and the first doped layer; and
a second metal line connecting the drain electrode and the first doped layer.

14. The HEMT of claim 13, wherein the passivation layer is on a sidewall of the mesa isolation.

15. The HEMT of claim 11, further comprising:
a first ohmic contact on the first doped layer adjacent to the source electrode; and
a second ohmic contact on the first doped layer adjacent to the drain electrode.

16. The HEMT of claim 15, wherein the first doped layer comprises a first doped region and the second ohmic contact comprises a second doped region.

17. The HEMT of claim 16, wherein the first doped region and the second doped region comprise different conductive types.

18. The HEMT of claim 11, further comprising:
an ohmic contact on the first doped layer adjacent to the source electrode; and
a Schottky contact on the first doped layer adjacent to the drain electrode.

19. The HEMT of claim 11, further comprising:
a second doped layer in the substrate and under the first doped layer;
a first metal line connecting the source electrode and the second doped layer; and
a second metal line connecting the drain electrode and the first doped layer.

20. The HEMT of claim 19, wherein the first doped layer and the second doped layer comprise different conductive type.

* * * * *